(12) United States Patent
Hong

(10) Patent No.: US 7,915,084 B2
(45) Date of Patent: Mar. 29, 2011

(54) METHOD FOR MAKING A STACKED PACKAGE SEMICONDUCTOR MODULE HAVING PACKAGES STACKED IN A CAVITY IN THE MODULE SUBSTRATE

(75) Inventor: Sungmin Hong, Suwon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/784,434

(22) Filed: May 20, 2010

(65) Prior Publication Data
US 2010/0240175 A1 Sep. 23, 2010

Related U.S. Application Data

(62) Division of application No. 11/381,683, filed on May 4, 2006, now Pat. No. 7,763,963.

(60) Provisional application No. 60/678,553, filed on May 4, 2005.

(51) Int. Cl.
*H01L 25/00* (2006.01)
*H01L 23/12* (2006.01)
(52) U.S. Cl. ........... 438/109; 438/127; 257/E23.125; 257/E25.027
(58) Field of Classification Search ............ 438/109, 438/122, 124, 127; 257/E23.123, E23.125, 257/E25.027
See application file for complete search history.

(56) References Cited

U.S. PATENT DOCUMENTS

| | | | |
|---|---|---|---|
| 6,201,302 B1 | 3/2001 | Tzu | |
| 6,388,333 B1 * | 5/2002 | Taniguchi et al. | ............ 257/777 |
| 6,395,578 B1 | 5/2002 | Shin et al. | |
| 6,787,916 B2 | 9/2004 | Halahan | |
| 7,061,120 B2 | 6/2006 | Shin et al. | |
| 7,176,506 B2 | 2/2007 | Beroz et al. | |
| 7,196,411 B2 | 3/2007 | Chang | |
| 7,217,994 B2 | 5/2007 | Zhu et al. | |
| 7,279,786 B2 | 10/2007 | Kim | |
| 7,344,915 B2 | 3/2008 | Appelt et al. | |
| 2004/0119152 A1 | 6/2004 | Karnezos et al. | |
| 2005/0051884 A1 | 3/2005 | Stevens et al. | |
| 2006/0170092 A1 | 8/2006 | Kim et al. | |
| 2006/0175695 A1 | 8/2006 | Lee | |
| 2006/0180911 A1 | 8/2006 | Jeong et al. | |

* cited by examiner

*Primary Examiner* — Sue Purvis
*Assistant Examiner* — W. Wendy Kuo

(57) ABSTRACT

A stacked die chip scale package, in which a stacked die assembly is mounted within a cavity in a module substrate. In some embodiments certain of the die are stacked on a front side of a stacked die assembly substrate, and the stacked die assembly substrate is inverted in the cavity and the substrate is electrically interconnected to a front side of the module substrate; others of the die are stacked on the back side of the stacked die assembly substrate, and are interconnected by wire bonds to the front side of the module substrate. In some embodiments, the cavity is covered by a heat sink, and the stacked die assembly is mounted onto the heat sink. Also, methods for making the module are provided.

4 Claims, 6 Drawing Sheets

US 7,915,084 B2

METHOD FOR MAKING A STACKED PACKAGE SEMICONDUCTOR MODULE HAVING PACKAGES STACKED IN A CAVITY IN THE MODULE SUBSTRATE

CROSS-REFERENCE TO RELATED APPLICATION(S)

This application is a divisional of co-pending U.S. patent application Ser. No. 11/381,683 filed May 4, 2006, which claims priority from U.S. Provisional Patent Application Ser. No. 60/678,553 filed May 4, 2005, which is hereby incorporated by reference herein.

BACKGROUND

This invention relates to stacked chip (stacked die) packages.

Increasingly, the semiconductor industry requires that packages have greater functionality in increasingly thin, small and compact package structures. There has been rapid progress in increasing the density of semiconductor devices in packages. In one approach, stacked chip scale package (SCSP) have been developed. These packages include two chips (or usually more than two chips), stacked on a substrate which has a chip mount area on the front surface and a solder ball pad area on the back surface. The chips are mounted using adhesive materials, and are electrically connected with the substrate using wire bonds which connect bond pads on the chip and bond fingers in a circuit pattern on the front surface of the substrate. Solder balls are mounted on the ball pads on the back surface of the substrate, for interconnection of the package with, for example, a motherboard. The die (chips), the wires, and other features on the front side of the substrate are encapsulated with an encapsulation material.

These features of such a conventional SCSP are shown diagrammatically by way of example in FIG. 1, in sectional view. The package includes a package substrate having a die mount region on a front surface, and second level interconnect solder ball pads on a back surface. The illustrated package includes six die (semiconductor chips), including two bare silicon spacer die, stacked and mounted on the die mount region of the front surface of a substrate.

The die are electrically interconnected to the substrate by wire bonds connecting bond pads on the respective die (die pads) to bond sites on a circuit pattern on the front surface of the substrate. Solder balls are mounted on ball pads on the back surface of the substrate, for second level interconnection of the package with, for example, a motherboard.

The lowermost (first) active die in the stack is affixed on a die mount region of the front surface of the substrate using an adhesive material, which may be a die attach epoxy, for example, or an adhesive film. A second active die is affixed onto the first die, again using an adhesive. A first spacer is affixed onto the first die, using an adhesive; the spacer may be, for example, a "dummy" die, cut from a silicon wafer having no circuitry, or it may be a glass chip, for example. A third active die is stacked over the spacer, and affixed using an adhesive. The third active die is as wide as or wider than the second active die, and the spacer is employed between the second active die and the third active die, so that the marginal parts of the third active die overhang the wire loops connecting the second active die to the substrate. The spacer must have a footprint selected to prevent interference by the spacer with the connection of the wire loops with the die pads, and must have a thickness selected to provide relief for the wire loop height (plus some tolerance). A second spacer is affixed onto the third active die, using an adhesive; this spacer may also be, for example, a "dummy" die. A fourth active die is stacked over the second spacer, and affixed using an adhesive. The fourth active die in this example is wider than the third active die, and the second spacer is employed between the third active die and the fourth active die, so that the marginal parts of the third active die overhang the wire loops connecting the third active die to the substrate. As noted above, this package when complete includes six-stacked chip, all of which contribute to the overall thickness of the package, but only four of the die have an electrical function. Accordingly, in such a conventional package the electronic density of the package, and the thinness profile, are compromised.

SUMMARY

This invention is directed to a package structure having stacked chips in a unit package which has a chip-mount area on the front and back surfaces of the substrate. The packages according to the invention provide for increased chip capacity in a package having a thin profile.

According to the invention a stacked die chip scale package module includes a stacked die assembly mounted within a cavity in a module substrate. In some embodiments one or more of the die are stacked on a front side of a stacked die assembly substrate, and the stacked die assembly substrate is inverted in the cavity and the substrate is electrically interconnected to a front side of the module substrate; one or more die are stacked on the back side of the stacked die assembly substrate, and are interconnected by wire bonds to the front side of the module substrate. In some embodiments, the cavity is covered by a heat sink, and the stacked die assembly is mounted onto the heat sink.

In one general aspect, the invention features a multi-chip module including: a stacked die assembly including an assembly substrate having a front side and a back side and having at least a first die mounted onto and electrically connected to the front side constituting an assembly package, the stacked die assembly further including at least a first additional die mounted onto the back side of the assembly substrate; and a module substrate having a front side and a back side, the module substrate having an opening therethrough having a length and width at least sufficient to accommodate a length and width of the assembly package; wherein the stacked die assembly is situated so that at least part of the assembly package is within the opening. The first die in the assembly package may be wire bonded to the assembly substrate, or may be mounted by flip chip interconnect to the assembly package. The first additional die may be wire bonded to the module substrate, or may be mounted by flip chip interconnection to the stacked die assembly substrate. In some embodiments a second die is mounted (and in some embodiments two or more die are mounted) over the first die in the assembly package; in such embodiments the first die may be wire bonded to the stacked die assembly package, or mounted by flip chip interconnect. In some embodiments a second additional die is mounted (and in some embodiments two or more additional die are mounted) over the first additional die; in such embodiments the first additional die may be wire bonded to the stacked die assembly package, or mounted by flip chip interconnect to the stacked die assembly package.

In some embodiments the die and interconnects on the front side of the stacked die assembly substrate are encapsulated or molded.

In some embodiments a support spans the opening in the module substrate, and the inverted package is mounted onto the support. In some such embodiments the support constitutes a cover over the entire opening at the back side of the module substrate.

In another general aspect the invention features a semiconductor multi-chip module substrate, including a dielectric layer and at least one patterned metal layer and having a front side and a back side, the substrate having an opening therethrough, the opening having a length and width sufficient at least to accommodate a footprint of a selected semiconductor package. In some embodiments the substrate comprises a two-metal layer substrate. In some embodiments a support spans the opening at the back side, and in some such embodiments the support covers the opening. In some embodiments the support comprises a metal sheet; the metal sheet may assist in heat dissipation or, where the metal sheet is electrically conductive and where the sheet is connected to a reference electrical potential ("ground" potential) the metal sheet may serve as an electromagnetic shield.

In another general aspect, methods for making the module include: providing a stacked die assembly substrate; affixing at least a first die on a front side of the assembly substrate and electrically connecting the die to sites at the front side of the assembly substrate to form a package; providing a module substrate having a front side and a back side and an opening through, the opening having a length and width at least as great as the length and width of the package; reversibly affixing the module substrate onto a stage; inverting the package and situating the package at least partly within the opening; mounting at least a first additional die at the back side of the assembly substrate to form a stacked die assembly, and electrically connecting the additional die to sites at the front side of the module substrate; encapsulating the stacked die assembly and interconnections and the front side of the module substrate; removing the module from the stage; and attaching second-level interconnect solder balls at sites in the back side of the module substrate.

In some embodiments the step of situating the package includes removably affixing a top surface of the package to the stage within the opening. In some embodiments, the step of providing the substrate includes providing a support spanning the opening at the back side of the substrate; in some such embodiments the step of situating the package includes affixing a top surface of the package to the support within the opening.

Because the thickness of the die on the front side of the stacked die assembly substrate are accommodated at least in part within the cavity, the thickness of the module can be made less than if the die are stacked serially upon one surface of the substrate. Also, in some assemblies, the die can be stacked according to their relative sizes, so that the need for spacers between adjacent die can in some assemblies be avoided, further reducing the thickness of the module.

In embodiments in which the die on the front side of the stacked die assembly are encapsulated, the assembly package can be tested prior to assembly, and only assembly packages that test as "good" are used in making modules. This results in improved module yield.

In embodiments in which the stacked die assembly is mounted on a heat sink at the back side of the module, so that a surface of the heat sink is exposed there, improved heat dissipation from the die stack is provided according to the invention.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1:
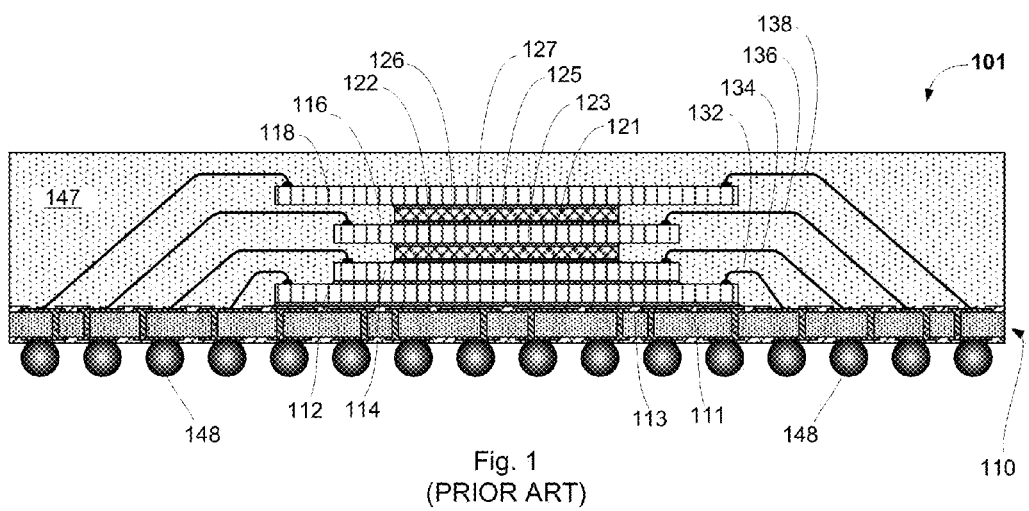
FIG. 1 is a diagrammatic sketch in a sectional view showing a conventional stacked chip scale package structure.

FIG. 1 shows a conventional stacked die chip package structure 101, including four semiconductor die 112, 114, 116, 118 mounted in a stack over, and electrically connected by wire bonds 132, 134, 136, 138 to, a substrate 110. The stacked die and the wire bond connections and the die mount side of the substrate are protected by an encapsulation 147, and solder balls 148 are provided on the opposite side of the substrate for second-level connection of the package 101 to underlying circuitry such as, for example, a motherboard. The substrate 110 in this example is a laminate substrate having two patterned metal layers separated by a dielectric layer, and connected to one another by vias through the dielectric layer. Each patterned metal layer is covered by a dielectric solder mask, having openings that expose sites on the metal layer for electrical connection of wire bonds or solder balls or other features. In the example illustrated in FIG. 1, a first die 112 is affixed using a die attach adhesive 111 onto a die attach region of the die mount side of the substrate 110. The active side of the die faces away from the substrate, and the die 112 is electrically connected to the substrate by wire bonds 132 running from interconnect pads on the active side of the die to bond pads in the metal layer at the die mount side of the substrate. A second die 114 is affixed using a die attach adhesive 113 onto a die attach region of the active side of the first die 112, inboard from the die pads. The second die in this example has a smaller footprint (length and/or width) than the first die, so that the second die does not interfere with the wire bonds 132. The active side of the first die typically has a passivation layer, and the adhesive 113 is a dielectric adhesive, so that the first and second die are electrically insulated from one another. The active side of the second die also faces away from the substrate, and the die 114 is electrically connected to the substrate by wire bonds 134 running from interconnect pads on the active side of the second die to bond pads in the metal layer at the die mount side of the substrate. A third die 116 is mounted over the second die; in this example the third die has a footprint the same as that of the second die and, accordingly, a first spacer is mounted between the second and third die to provide relief for the wire bonds 134. The first spacer 122 in this example is a "dummy" die, and is affixed using a die attach adhesive 121 onto a die attach region of the active side of the second die 114, inboard from the die pads. The first spacer in this example has a smaller footprint (length and/or width) than the second die, so that the third die does not interfere with the wire bonds 134. The active side of the second die typically has a passivation layer, and the adhesive 121 is a dielectric adhesive, so that the second die and the first spacer are electrically insulated from one another. The third die 116 is affixed using an adhesive 123 onto the first spacer 122. The active side of the third die also faces away from the substrate, and the die 116 is electrically connected to the substrate by wire bonds 136 running from interconnect pads on the active side of the second die to bond pads in the metal layer at the die mount side of the substrate. A fourth die 118 is mounted over the third die; in this example the fourth die has a larger footprint than the second die and, accordingly, a second spacer is mounted between the third die and the fourth die to provide relief for the wire bonds 136. The second spacer 126 in this example is a "dummy" die, and is affixed using a die attach adhesive 123 onto a die attach region of the active side of the third die 116, inboard from the die pads. The second spacer in this example has a smaller footprint (length and/or width) than the third die, so that the fourth die does not interfere with the wire bonds 136. The active side of the third die typically has a passivation layer, and the adhesive 125 is a dielectric adhesive, so that the third die and the second spacer are electrically insulated from one another. The fourth die 118 is affixed using an adhesive 127 onto the second spacer 126. The active side of the fourth die also faces away from the substrate, and the die 118 is electrically connected to the substrate by wire bonds 138 running from interconnect pads on the active side of the second die to bond pads in the metal layer at the die mount side of the substrate.

A conventional stacked die package structure as in FIG. 1 is conventionally made by providing the substrate, mounting the first die on the substrate, mounting the second die on the first die, forming wire bonds to connect the first and second die to the substrate, mounting the first spacer on the second die, mounting the third die on the first spacer, forming wire bonds to connect the third die to the substrate, mounting the second spacer on the third die, mounting the fourth die on the second spacer, forming wire bonds to connect the fourth die to the substrate, forming the encapsulation, and affixing the second level interconnect solder balls. Testing of bare die is ordinarily not preferred, particularly where the die has a high i/o density and small die pads, as contact of the testing probes with the die pads can damage the pads. Additionally, testing of interconnected die on a substrate may be impractical unless the die and, particularly, the wire bonds, are protected by molding or encapsulation. Consequently, the die in a package as in FIG. 1 cannot be tested until the package is complete at least through the encapsulation step. If any one of the four die is defective, then the package must be discarded even though the remaining die be acceptable. Considerable waste results, both of acceptable die in rejected packages, and of manufacturing resources.

Figure 2:
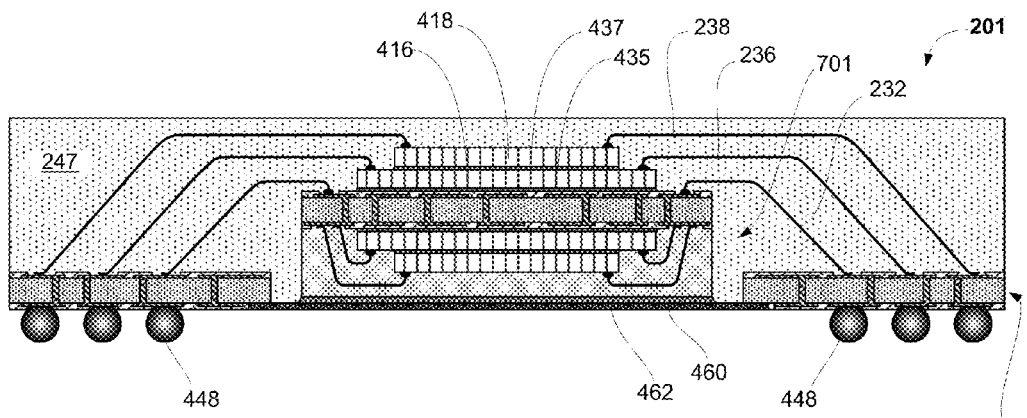
FIG. 2 is a diagrammatic sketch in a sectional view showing a multi-chip module according to an embodiment of the invention.

FIG. 2 shows a module 201 according to an embodiment of the invention, in a diagrammatic sectional view. The construction of the module may be well understood by reference to FIGS. 3A-3C, which show part of the stacked die assembly, which is defined as an assembly with one die attached directly on top of another die. The construction of the module may also be well understood by reference to FIGS. 4A and 4B, which show the module substrate having a cavity to accommodate the stacked die assembly; and FIGS. 7A-7E, which show steps in the construction of the module.

The module 201 in the example shown in FIG. 2 includes a substrate 401 having an opening (cavity) and a support 460 spanning the opening (shown in greater detail in FIG. 4A); and a stacked die assembly mounted on the support 460 (including an inverted package 701 affixed using an adhesive 462 to the support, and additional die 416 and 418 stacked over the stacked die package). The package 701 is a stacked die package (shown in greater detail in FIG. 7A), having two die, one stacked over the other, and both die electrically connected to a package substrate (shown in greater detail in FIG. 3A). The package 701 is encapsulated, and is electrically connected with the module substrate 401 by wire bonds 232 connecting bond sites on the package substrate with bond pads on the assembly interconnect side (the "front" or "upper" side) of the module substrate. The first additional die 416 is affixed using an adhesive 435 to the land side of the package substrate, and the second additional die 418 is affixed using an adhesive 437 onto a die attach region of the active side of the first additional die 416, inboard from the die pads. The additional die 416, 418 are electrically connected with the module substrate 401 by wire bonds 236, 238 connecting bond pads on the die with bond pads on the front side of the module substrate. The stacked die assembly, the wire bonds, and the assembly interconnect side (the "front" or "upper" side) of the substrate are protected by an encapsulation 247. Solder balls 448 are provided on ball pads on the side of the module substrate 401, opposite the front side (the "back" or "lower" side), for second-level interconnection to underlying circuitry (such as, for example, a printed circuit board such as a motherboard) in a device in which the module is used (such as, for example, a computer, a mobile computing or telecommunications device, or the like).

Figure 4B:
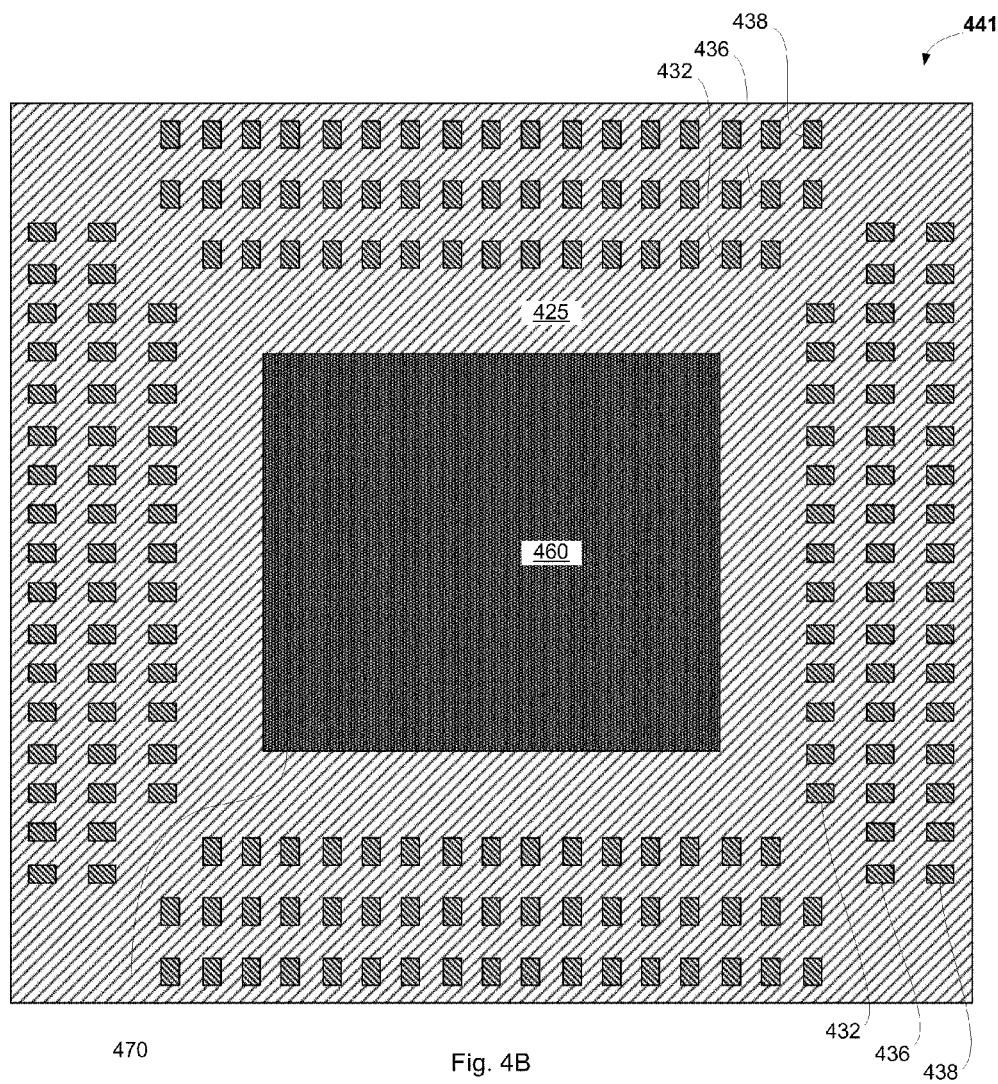
FIG. 4B is a diagrammatic sketch in a plan view showing a substrate as in FIG. 4A.
Figure 4A:
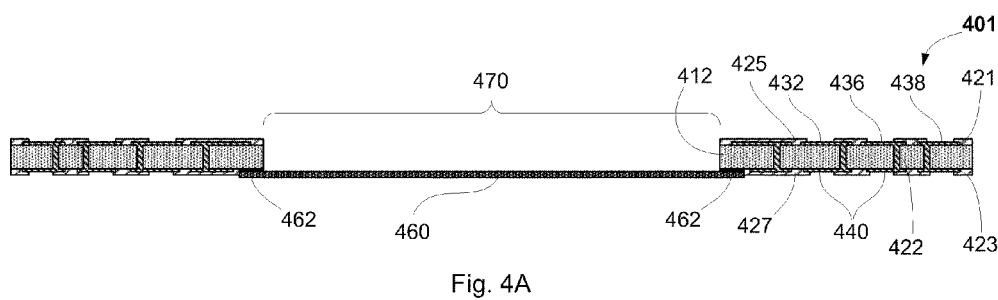
FIG. 4A is a diagrammatic sketch in a sectional view showing a module substrate for use in a multi-chip module as in FIG. 2 according to an embodiment of the invention.

Referring now to FIGS. 4A and 4B, a module substrate 301 according to an embodiment of the invention is shown in a plan view of the front side (FIG. 4B) and in a sectional view (FIG. 4A). The module substrate in this example is a laminate substrate having two metallizations or patterned metal layers 421 (at the front side of the substrate) and 423 (at the back side) separated by a dielectric layer 412 and connected by vias 422 through the dielectric layer. Solder masks 425, 427 covering the metal layers 421, 423 have openings exposing sites on the metal layers for electrical connection, including for example wire bond sites 432, 436, 438 for connection of wire bonds 232, 236, 238 on the front side and ball pads on the back side for attachment of second level interconnects such as solder balls 448. The module substrate 401 according to this aspect of the invention has an opening 470 formed entirely through the upper (front side) metal layer and the dielectric, and the lower (back side) metal layer. A support 460 is in direct contact with the dielectric layer 412 outside of the opening and spans the opening at the back side, and is affixed, using an adhesive 462, at a margin of the opening. In this example the support 460 is a heat dissipation member (heat sink), which may be a metal sheet, and in this example it covers the opening on the lower (back) side. The front side of the substrate 401, viewed in plan as in FIG. 4B, is provided with bond fingers 432, 436, 438 for electrical connection by wire bonds 232, 236, 238 with the various die and the package substrate in the stacked die assembly.

Figure 3B:
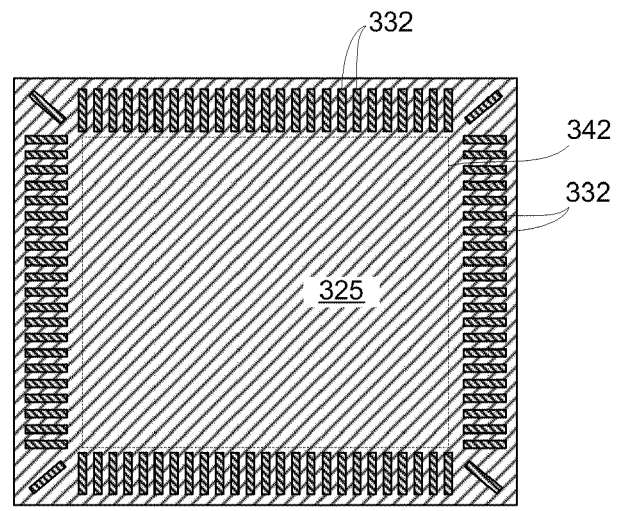
FIGS. 3B and 3C are diagrammatic sketches in a plan view showing a substrate as in FIG. 3A.
Figure 3A:
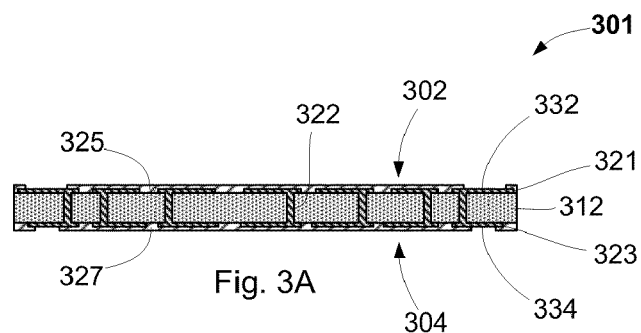
FIG. 3A is a diagrammatic sketch in a sectional view showing a substrate for a stacked die assembly for use in a multi-chip module as in FIG. 2 according to an embodiment of the invention.
Figure 3C:
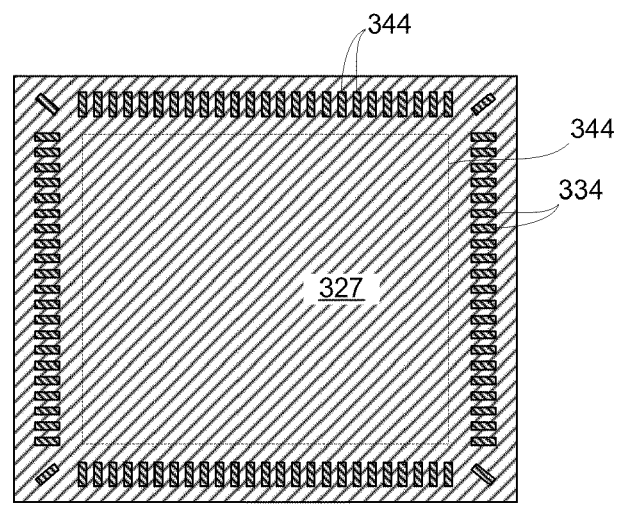

FIGS. 3A, 3B and 3C show an example of a substrate 301 for the stacked die assembly. The stacked die assembly substrate in this example includes a dielectric layer 312, with metallizations (patterned metal circuitry) 321, 323 at both a front side 302 and a back side 304, as shown in a sectional view in FIG. 3A, and in plan views in FIGS. 3B and 3C. Solder masks 325, 327 covering the metal layers 421, 423 have openings exposing sites on bond fingers in the metal layers for electrical connection, including for example wire bond sites 332 on the front side for connection of wire bonds 736, 738 from the die 716, 718 and bond pads 334 on the back side for connection of wire bonds from the package substrate 301 to the module substrate 401.

The module substrate is shown for purposes of illustration as being symmetrical in transverse sectional view; that is, the opening through the module substrate appears in the drawings to be centrally located in the substrate. This is not necessary; the opening can be formed toward a side or a corner of the substrate and, in embodiments where additional die have interconnect pads asymmetrically arranged, an asymmetrical arrangement of bond pads on the module substrate may be preferred and, accordingly, the opening may be situated so that there is a greater area of module substrate adjacent one or two sides of the opening for additional bond pads and circuitry.

Figure 7A:
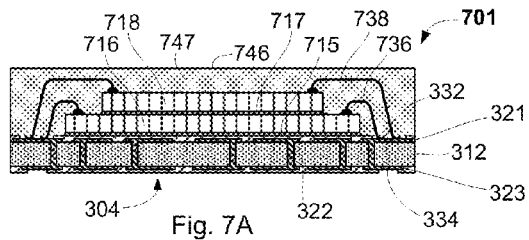
FIGS. 7A-7E are diagrammatic sketches in sectional view showing steps in assembly of a multi-chip module as in FIG. 2 according to an embodiment of the invention.

The stacked die package 701 in the stacked die assembly as appears in FIG. 2 is shown in detail in FIG. 7A. The stacked die package 701 includes a substrate generally as described above, including a dielectric layer 312, with patterned metal circuitry 321, 323 at both a front side 302 and a back side 304, as shown in a sectional view in FIG. 3A, and in plan views in FIGS. 3B and 3C. Solder masks 325, 327 covering the metal layers 421, 423 have openings exposing sites on bond fingers in the metal layers for electrical connection, including for example wire bond sites 332 on the front side for connection of wire bonds 736, 738 from the die 716, 718 and bond pads 334 on the back side for connection of wire bonds from the package substrate 301 to the module substrate 401. A first die 716 is affixed using an adhesive 715 to a die mount region of the front side of the substrate 301, and is electrically connected to the substrate by wire bonds 736 from pads on the first die to wire bonds sites 332 at the front side of the substrate 301. A second die 718 is affixed using an adhesive 717 to a die mount region of the active side of the substrate first die 716, inboard of the die pads on the first die, and is electrically connected to the substrate by wire bonds 738 from pads on the second die to wire bonds sites 332 at the front side of the substrate 301. The die and the wire bonds and the die mount side of the substrate are enclosed by an encapsulation 747, which has a surface defining an upper side 746 of the package 701. The package shown in these examples is saw- or punch-singulated; that is, the package is shown having been made as a strip or array of packages, all of which were covered with the encapsulant and then separated by cutting through the substrate and the encapsulation. Alternatively, the package could be molded.

Referring now to FIGS. 7A-7E, a module as in FIG. 2 is made by providing a stacked die assembly substrate as in FIGS. 3A-3C, for example, and stacking die on a die mount region of the front surface, wire bonding the die to the front surface of the stacked die substrate, and encapsulating the stacked die and the wires, to make a stacked die chip scale package 701 as shown in FIG. 7A. This may be provided as a standardized package. The packages can be tested prior to assembly in the module, and packages not meeting performance specifications can be discarded, so that only packages 701 testing as "good" are used in the assemblies.

Figure 7B:
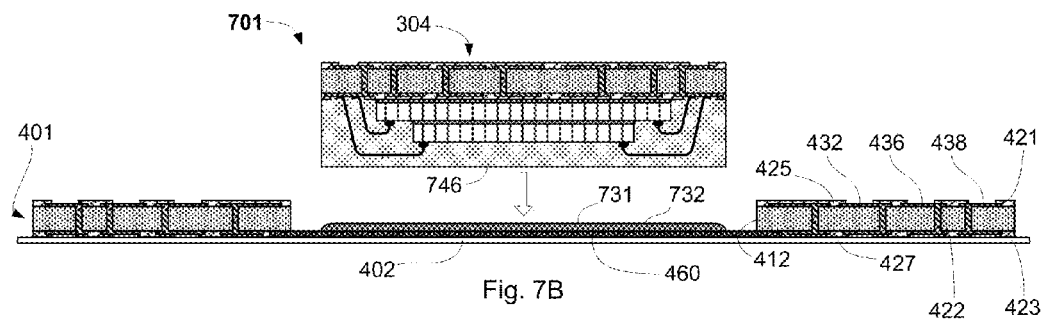
Figure 7C:
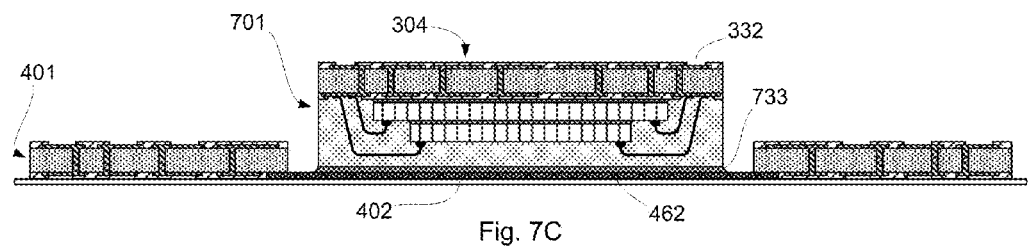

Then, as shown in FIG. 7B, a module substrate 401 having a cavity (as shown for example in FIGS. 4A and 4B) is provided, and is removably affixed to a stage represented at 402. An adhesive material 732 is deposited on the support 460, and the stacked die ship scale package as shown for example in FIG. 7A is inverted and inserted into the cavity and placed upon a surface 731 of the adhesive material 732. The package 701 is said herein to be "inverted" in the sense that the die mount (front) side of the package substrate 301 faces in a direction opposite the assembly interconnect (front) side of the module substrate 401. That is, the land side (back side) of the package substrate 301—and, accordingly, the back side of the package 701—faces away from the support 460, and the surface of the encapsulation 747 (the "upper" side 746 of the package 701 as viewed in FIG. 7A) faces downward toward the support when inverted, and the upper side 746 contacts the surface 731 of the adhesive material 732. The adhesive is then cured as may be appropriate, as shown at 462 in FIG. 7C. Where a die mount adhesive is applied in a liquid or paste form, a fillet 733 is typically formed at the edges of the package surface 746 of the package molding. The package 701 is further depicted as mounted to and directly supported by the support 460 in FIG. 7C.

Figure 7D:
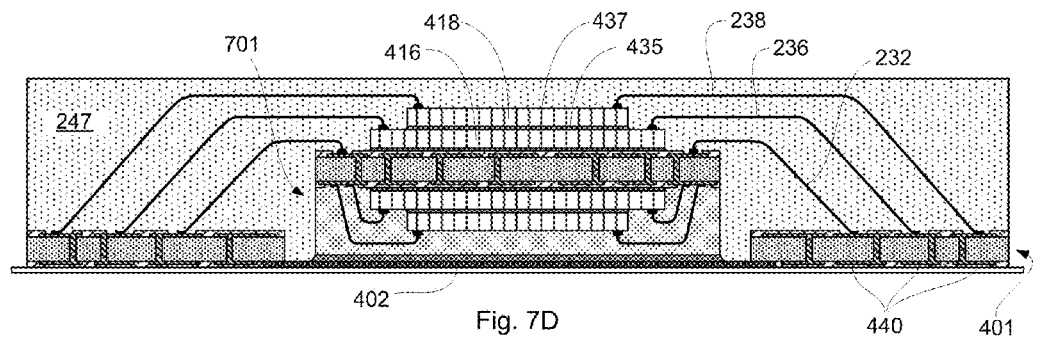
Figure 7E:
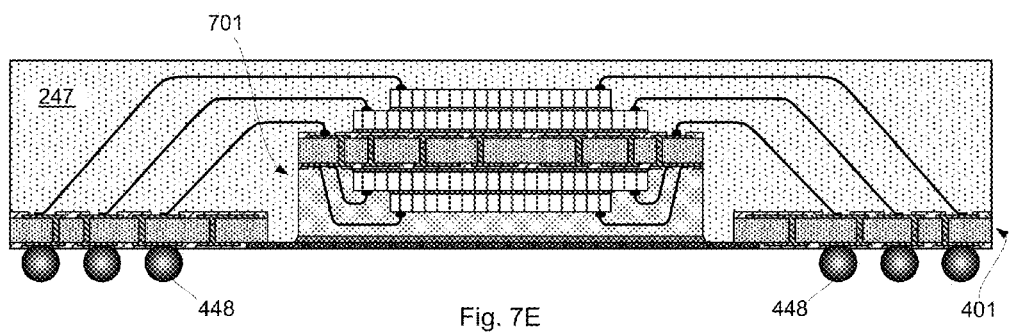

Then the mounted package 701 is electrically connected to the module substrate 401 by wire bonds 232 connecting bond pads on the land side 304 of the package with bond pads 432 on the assembly interconnect side of the substrate 401. Then a first additional die 416 is mounted using an adhesive 435 on the land side 304 of the package 701, and the first additional die 416 is electrically connected to the module substrate 401 by wire bonds 236 connecting pads on the die 416 with bond pads 436 on the assembly interconnect side of the substrate; and a second additional die 418 is mounted using an adhesive 437 on the active side of the first additional die 416 inboard of the die pads, and the second additional die 418 is electrically connected to the module substrate 401 by wire bonds 428 connecting pads on the die 418 with bond pads 438 on the assembly interconnect side of the substrate Then, one or more additional die (two, in this example) are mounted over a die attach region of the back side (upward-facing in FIGS. 2, 7C, 7D, 7E, for example) of the inverted stacked die assembly substrate 301, and the die are interconnected by wire bonding to bond fingers on the front side of the module substrate. This completes the stacked die assembly, in situ in the module substrate cavity. Referring now to FIG. 7D, the first additional die 416 is affixed using an adhesive 435 to the land side of the package substrate, and the second additional die 418 is affixed using an adhesive 437 to a die attach region of the active side of the first additional die 416, inboard from the die pads. The additional die 416, 418 are electrically connected with the module substrate 401 by wire bonds 236, 238 connecting bond pads on the die with bond pads 436, 438 on the front side of the module substrate. The stacked die assembly, the wire bonds, and the assembly interconnect side (the "front" or "upper" side) of the substrate are protected by an encapsulation 247. This results in the structure shown in FIG. 7D. The module shown in these examples is saw- or punch-singulated; that is, the module is shown having been made as a strip or array of modules, all of which were covered with the encapsulant and then separated by cutting through the module substrate and the encapsulation. Alternatively, the package could be molded. This structure is removed from the stage 402, and it can be tested, prior to attachment of solder balls 448 on ball pads 440 on the side of the module substrate 401, opposite the front side (the "back" or "lower" side), as shown in FIG. 7E, for second-level interconnection to underlying circuitry (such as, for example, a printed circuit board such as a motherboard) in a device in which the module is used (such as, for example, a computer, a mobile computing or telecommunications device, or the like).

Figure 8:
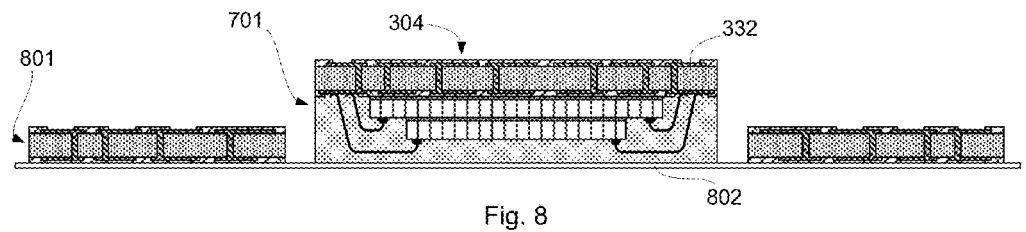
FIG. 8 is a diagrammatic sketch in a sectional view showing a step in manufacture of a multi-chip module according to yet another embodiment of the invention.

In some embodiments of the invention, no support is provided spanning the cavity. The method for making modules according to such embodiments is similar to that described with reference to FIGS. 7A-7E, except that, as shown in FIG. 8, the substrate is provided with an opening but without the support (460 in FIG. 7B). The substrate is mounted (removably affixed) on the stage 802, and the assembly package 701 is mounted on the stage 802 within the opening. Following steps as described for example with reference to FIGS. 7C and 7D, the assembly is removed from the stage 802, and the structural integrity is maintained by the module encapsulation.

Figure 5:
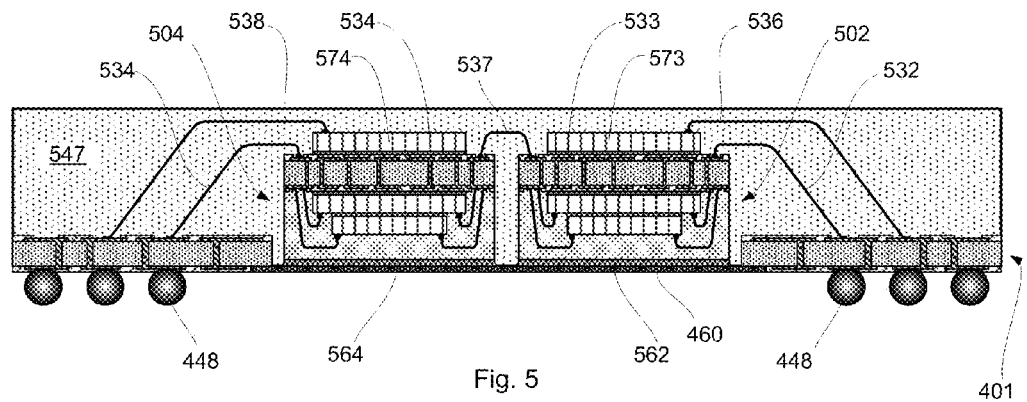
FIG. 5 is a diagrammatic sketch in a sectional view showing a multi-chip module according to another embodiment of the invention.
Figure 6:
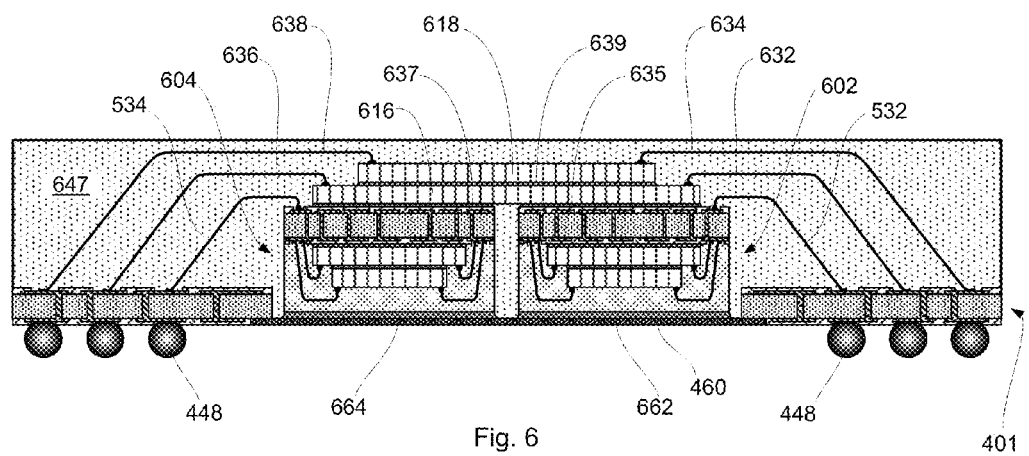
FIG. 6 is a diagrammatic sketch in a sectional view showing a multi-chip module according to yet another embodiment of the invention.

Various stacked die assembly configurations are possible according to the invention, and more than one stacked die substrate may be mounted within the cavity in the module substrate, as shown for example in FIGS. 5 and 6.

FIG. 5 shows a module according to the invention, having two stacked die assemblies 502, 504 mounted side-by-side on a support 460 in a cavity in a module substrate 401. Each stacked die assembly 502, 504 includes an inverted stacked die package, constructed generally as described above with reference to FIGS. 3A-3C and 7A, mounted using an adhesive 562, 564 onto the support 460; the stacked die assembly substrates are connected to one another by wire bonds 537, and each package is electrically connected to the module substrate by wire bonds 532, 534 connecting bond pads 334 on the package substrates with bond pads 432 on the assembly interconnect side of the module substrate 401. In this example an additional die 573, 574 is affixed using an adhesive 533, 544 onto the land side of the stacked die assembly substrate, and each additional die 573, 574 is electrically connected to the module substrate by wire bonds 536, 538 connecting pads on the die to bond sites on the assembly interconnect side of the module substrate 401. The stacked die assemblies, the wire bonds, and the assembly interconnect side (the "front" or "upper" side) of the substrate are protected by an encapsulation 547, and solder balls 448 are attached on ball pads 440 on the side of the module substrate 401, opposite the front side (the "back" or "lower" side), for second-level interconnection to underlying circuitry (such as, for example, a printed circuit board such as a motherboard) in a device in which the module is used (such as, for example, a computer, a mobile computing or telecommunications device, or the like).

FIG. 6 shows a module according to the invention, having two inverted stacked die packages 602, 604 mounted side-by-side on a support 460 in a cavity in a module substrate 401. Each stacked die package 502, 504, constructed generally as described above with reference to FIGS. 3A-3C and 7A, is mounted using an adhesive 662, 664 onto the support 460; and each package is electrically connected to the module substrate by wire bonds 532, 534 connecting bond pads 334 on the package substrates with bond pads 432 on the assembly interconnect side of the module substrate 401. In this example, a first additional die 616, having a large footprint, is mounted over both stacked die packages 602, 604 and is affixed onto the land sides of both stacked die packages using adhesives 635, 637. The first additional die 616 is electrically connected to the module substrate by wire bonds 632, 636 connecting pads on the die to bond sites 436 on the assembly interconnect side of the module substrate 401. A second additional die 618, having a larger footprint than the first additional die 616, is mounted using an adhesive 639 on the active side of the first additional die 616. The second additional die 618 is electrically connected to the module substrate by wire bonds 634, 638 connecting pads on the die to bond sites 438 on the assembly interconnect side of the module substrate 401. The stacked die packages, the additional die, the wire bonds, and the assembly interconnect side (the "front" or "upper" side) of the substrate are protected by an encapsulation 647, and solder balls 448 are attached on ball pads 440 on the side of the module substrate 401, opposite the front side (the "back" or "lower" side), for second-level interconnection to underlying circuitry (such as, for example, a printed circuit board such as a motherboard) in a device in which the module is used (such as, for example, a computer, a mobile computing or telecommunications device, or the like).

Other embodiments and variations are contemplated by the invention.

For example, other substrate types than the two-metal layer laminate substrates shown in the FIGs. can be employed according to the invention as the module substrate and/or as the stacked die package substrate or stacked die assembly substrate. Suitable substrates include tape substrates having one or two metal layers; laminate substrates having two, three or more metal layers; build-up substrates having two, four, or six or more metal layers; substrates having organic polymer dielectric layers or silicon dielectric layers; and others.

And, for example, one or more of the die may be mounted by flip-chip interconnection. Flip chip interconnection is well-known; generally, a flip chip is oriented with the active side of the die facing toward the mounting surface (rather than facing away from the mounting surface, as in wire bond interconnection), and electrical connection is made by balls or bumps (such as solder balls or bumps, or gold stud bumps) attached to pads on the die and to complementary sites on the electrical circuitry at the mounting surface. Particularly, for example, in the stacked die package according to the invention, a first die may be mounted onto the front side of the package substrate by flip chip interconnection, and a second (and subsequent) die in the stack may be attached using an adhesive to the backside of the first die, and electrically connected to the package substrate by wire bonding. And, for example, a first additional die may be mounted onto the land side (back side) of the package substrate by flip chip interconnection, and a second (and subsequent) additional die may be attached using an adhesive to the backside of the first additional die, and electrically connected to the module substrate by wire bonding.

Figure 9:
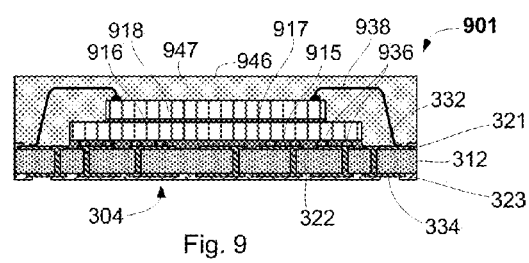
FIG. 9 is a diagrammatic sketch in a sectional view showing a multi-chip module according to yet another embodiment of the invention.

Referring now to FIG. 9, for example, an assembly package 901 is similar to the assembly package 701, except that in the assembly package 901 the first die is a flip chip die. In this example the stacked die assembly substrate is constructed generally as described with reference to FIGS. 3A, 3B, 3C. The first die 916 is oriented with the active side facing the substrate and is electrically connected to the front side of the assembly substrate by balls or bumps 936 attached to pads in the active side of the die and joined to interconnect sites on the patterned metal layer 321 at the front side of the substrate. In this example an underfill 915 protects the interconnections. The second die 918 is affixed to the backside of the first die using an adhesive 917, with the active side of the second die facing away from the substrate, and the second die is connected to the substrate by wire bonds 938 connecting pads on the die with bond sites 332 on the front side of the substrate. An encapsulation 947 encloses the die, the sires, and the front side of the substrate, having a surface 946 defining a top surface of the package.

Figure 10:
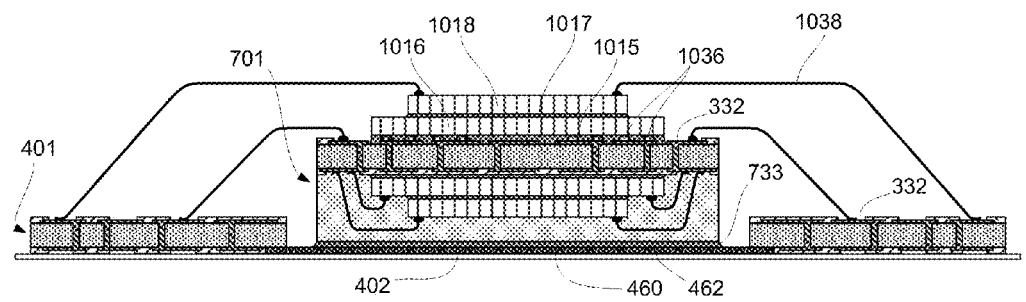
FIG. 10 is a diagrammatic sketch in a sectional view showing a step in manufacture of a multi-chip module according to yet another embodiment of the invention.

Referring now to FIG. 10, for example, an assembly is shown at a stage of manufacture of a module in which the first additional die on the stacked die assembly is a flip chip die. The module assembly with the assembly package 701 mounted on the support is generally as described with reference to FIG. 7C. A first additional die 1016 is oriented with the active side facing the assembly substrate and is electrically connected to the front side of the assembly substrate by balls or bumps 1036 attached to pads in the active side of the die and joined to interconnect sites on the patterned metal layer 332 at the back side of the assembly substrate. In this example an underfill 1015 protects the interconnections. The second die 1018 is affixed to the backside of the first die using an adhesive 1017, with the active side of the second die facing away from the assembly substrate, and the second die is connected to the module substrate 401 by wire bonds 1038 connecting bond sites 332 on the front side of the assembly substrate with bond pads 432 on the front side of the module substrate.

And, for example, where adjacent stacked die in a stacked die package or over the package substrate in a module according to the invention are wire bonded, a spacer may be provided between adjacent die, to prevent interference of a second die with wire bonds on a first die.

And, for example, the package that is mounted in the cavity according to the invention may have more than two stacked die (as shown in most of the FIGs.), or only one die. And there may be more than one additional die stacked over the package substrate; or there may be more than two additional die stacked over the package substrate.

Other embodiments are within the following claims.

What is claimed is:

1. A method for making a stacked package semiconductor module, comprising:
   providing a stacked die assembly substrate;
   affixing at least a first die on a front side of the assembly substrate and electrically connecting the die to sites at the front side of the assembly substrate to form a package;
   providing a module substrate having a front side and a back side and an opening through, the opening having a length and width at least as great as the length and width of the package;
   reversibly affixing the module substrate onto a stage;
   inverting the package and situating the package at least partly within the opening;
   mounting at least a first additional die at the back side of the assembly substrate to form a stacked die assembly, and electrically connecting the additional die to sites at the front side of the module substrate;
   encapsulating the stacked die assembly and interconnections and the front side of the module substrate; and
   removing the module from the stage.

2. The method of claim 1, further comprising attaching second-level interconnect solder balls at sites in the back side of the module substrate.

3. The method of claim 1 wherein the step of situating the package includes removably affixing a top surface of the package to the stage within the opening.

4. The method of claim 1 wherein the step of providing the substrate includes providing a support spanning the opening at the back side of the substrate; in some such embodiments the step of situating the package includes affixing a top surface of the package to the support within the opening.

* * * * *